(12) United States Patent
Vilhonen et al.

(10) Patent No.: US 10,338,646 B1
(45) Date of Patent: Jul. 2, 2019

(54) RADIO FREQUENCY AMPLIFIER CIRCUIT AND MOBILE TERMINAL HAVING THE SAME

(71) Applicant: LG ELECTRONICS INC., Seoul (KR)

(72) Inventors: Sami Vilhonen, Turku (FI); Harri Riihihuhta, Turku (FI); Jari Heikkinen, Turku (FI)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/999,457

(22) PCT Filed: Apr. 5, 2018

(86) PCT No.: PCT/KR2018/004035
§ 371 (c)(1),
(2) Date: Aug. 17, 2018

Related U.S. Application Data

(60) Provisional application No. 62/633,614, filed on Feb. 22, 2018.

(51) Int. Cl.
*H04B 1/04* (2006.01)
*G06F 1/16* (2006.01)
(Continued)

(52) U.S. Cl.
CPC ............ *G06F 1/1698* (2013.01); *H02M 7/44* (2013.01); *H03F 1/3241* (2013.01); *H04B 1/005* (2013.01)

(58) Field of Classification Search
CPC ........ H04B 1/04; H04B 1/0483; H04B 1/005; H04B 2001/0425; H03F 1/3241
See application file for complete search history.

(56) References Cited

U.S. PATENT DOCUMENTS

| 8,917,792 B2 * | 12/2014 | Black | H04B 15/00 |
| | | | 375/259 |
| 2011/0145882 A1 * | 6/2011 | Choi | H04H 20/26 |
| | | | 725/127 |

(Continued)

FOREIGN PATENT DOCUMENTS

| EP | 2515444 A1 * | 10/2012 | .......... H04B 1/0475 |
| JP | 2009510832 | 3/2009 | |

(Continued)

OTHER PUBLICATIONS

PCT International Application No. PCT/KR2018/004035, Notification of Transmittal of the International Search Report and the Written Opinion of the International Searching Authority, or Declaration dated Nov. 14, 2018, 10 pages.

*Primary Examiner* — Tuan Pham
(74) *Attorney, Agent, or Firm* — Lee, Hong, Degerman, Kang & Waimey PC

(57) ABSTRACT

A mobile terminal according to the present invention includes a main transmitter to amplify and transmit a first signal of a first frequency band through a first path and a second path, and an auxiliary transmitter to amplify and transmit a second signal of a second frequency band through a third path. The mobile terminal further includes a controller to control the amplified first signal and the amplified second signal to be combined with each other when the distortion signal is to occur in frequency bands adjacent to the first frequency band due to the amplified first signal, thereby providing a radio frequency (RF) front end and a mobile terminal with improved non-linearity.

14 Claims, 7 Drawing Sheets

(51) Int. Cl.
*H02M 7/44* (2006.01)
*H04B 1/00* (2006.01)
*H03F 1/32* (2006.01)

(56) References Cited

U.S. PATENT DOCUMENTS

| | | |
|---|---|---|
| 2013/0051212 A1 | 2/2013 | Suzuki et al. |
| 2013/0100999 A1 | 4/2013 | Furuta et al. |
| 2013/0208827 A1* | 8/2013 | Muhammad ........ H04L 27/2089 375/297 |
| 2015/0030105 A1 | 1/2015 | Vora et al. |
| 2017/0346510 A1 | 11/2017 | Chen et al. |

FOREIGN PATENT DOCUMENTS

| | | | | |
|---|---|---|---|---|
| KR | 20090010941 A | * | 1/2009 | ............... H04B 1/14 |
| KR | 1020090010941 | | 1/2009 | |
| KR | 20100042243 A | * | 4/2010 | ........... H03F 1/3247 |
| WO | WO-2011084790 A2 | * | 7/2011 | ........... H04B 1/0475 |

\* cited by examiner

RADIO FREQUENCY AMPLIFIER CIRCUIT AND MOBILE TERMINAL HAVING THE SAME

CROSS-REFERENCE TO RELATED APPLICATIONS

This application is the National Stage filing under 35 U.S.C. 371 of International Application No. PCT/KR2018/004035, filed on Apr. 5, 2018, which claims the benefit of U.S. Provisional Application No. 62/633,614, filed on Feb. 22, 2018, the contents of which are all hereby incorporated by reference herein in their entirety.

TECHNICAL FIELD

The present invention relates to a mobile terminal having a radio frequency amplifier circuit for amplifying a radio signal. More particularly, the present invention relates to a mobile terminal having a radio frequency amplifier circuit, capable of compensating for distortion characteristics of the radio frequency amplifier.

BACKGROUND ART

Terminals may be divided into mobile/portable terminals and stationary terminals according to mobility. Also, the mobile terminals may be classified into handheld types and vehicle mount types according to whether or not a user can directly carry.

Mobile terminals have become increasingly more functional. Examples of such functions include data and voice communications, capturing images and video via a camera, recording audio, playing music files via a speaker system, and displaying images and video on a display unit. Some mobile terminals include additional functionality which supports electronic game playing, while other terminals are configured as multimedia players. Specifically, in recent time, mobile terminals can receive broadcast and multicast signals to allow viewing of video or television programs As it becomes multifunctional, a mobile terminal can be allowed to capture still images or moving images, play music or video files, play games, receive broadcast and the like, so as to be implemented as an integrated multimedia player.

Efforts are ongoing to support and increase the functionality of mobile terminals. Such efforts include software and hardware improvements, as well as changes and improvements in the structural components.

In addition to those attempts, the mobile terminals provide various services in recent years by virtue of commercialization of wireless communication systems using an LTE communication technology. In the future, it is expected that a wireless communication system using a fifth generation (5G) communication technology will be commercialized to provide various services. In this regard, when a high input signal is applied to a amplifier operating in an RF frequency band, a nonlinear output signal is generated in adjacent frequency bands, thereby deteriorating the performance of the communication system.

In particular, an amplifier, such as in a 5G communication system, which operates in higher frequency bands, has lower saturated input power than the related art LTE communication system. Therefore, the amplifier, such as the 5G communication system, which operates in the higher frequency bands, has a problem of the performance degradation of the communication system due to the nonlinear output signal.

DISCLOSURE OF THE INVENTION

The present invention is directed to solving the aforementioned problems and other drawbacks. Another object of the present invention is to provide a mobile terminal having an amplifier with improved linearity performance.

Another object of the present invention is to provide a mobile terminal having an RF front-end structure, capable of solving a non-linearity problem in adjacent frequency bands.

According to one aspect of the present invention to achieve the objects and other purposes, a mobile terminal includes a main transmitter to amplify and transmit a first signal of a first frequency band through a first path and a second path, and an auxiliary transmitter to amplify and transmit a second signal of a second frequency band through a third path. The mobile terminal may further include a controller to control a distortion signal by combining the amplified first signal and the amplified second signal with each other when the distortion signal is to occur in frequency bands adjacent to the first frequency band, thereby providing an RF front end and a mobile terminal with improved non-linearity.

In one embodiment, the controller may control the amplified first signal to be transmitted to a base station only through the main transmitter when the distortion signal is not to occur in the adjacent frequency bands.

In one embodiment, the controller may control the amplified second signal to be transmitted to the base station or a peripheral terminal only through the auxiliary transmitter when it is determined that a power transmission mode is a low power transmission mode.

In one embodiment, the main transmitter may include a first amplifier connected to a first Local Oscillator (LO) on the first path to amplify an in-phase component of the first signal, and a second amplifier connected to a second local oscillator on the second path to amplify a quadrature-phase component of the first signal. In addition, the main transmitter may further include and a signal combiner to combine the amplified in-phase component and the amplified quadrature-phase component of the first signal. In this regard, the first LO and the second LO is implemented physically in one local oscillator with many signals derived from the one local oscillator. For example, many signals are the phase shifted complex signals I and Q (in-phase and quadrature-phase).

In one embodiment, the auxiliary transmitter may further include a third amplifier connected to a third local oscillator on the third path to amplify the second signal. On the other hand, the signal combiner may combine the amplified second signal with the amplified first signal when the distortion signal is to occur.

In one embodiment, the mobile terminal may further include a phase controller to control a phase value of the second signal, such that the amplified first signal and the amplified second signal are canceled with each other in the frequency bands adjacent to the first frequency band, and a switch to control the connection between the first to third paths and local oscillators.

In one embodiment, the third path may be connected to the third local oscillator through the switch when it is determined that a power transmission mode is a low power transmission mode. On the other hand, the first path and the second path may be connected to the first local oscillator and the second local oscillator through the switch when it is determined that the power transmission mode is a high-power transmission mode and the distortion is not to occur. The first to third paths may be connected to the first to third local oscillators through the switch when it is determined that the power transmission mode is the high-power transmission mode and the distortion is to occur.

In one embodiment, the main transmitter may operate in the first frequency band that is a narrow band, and the auxiliary transmitter may operate in the second frequency band that is a wide band. At this time, the second frequency band may be set to include the first frequency band.

In one embodiment, the controller may adjust a gain of the third amplifier such that a level of the amplified second signal coincides with a level of the amplified first signal in a specific frequency within the frequency bands adjacent to the first frequency band.

In one embodiment, the mobile terminal may further include a first filter to pass an in-phase component and a quadrature-phase component of the first signal in the first frequency band, and a second filter to pass an in-phase component and a quadrature-phase component of the second signal in the second frequency band. At this time, the controller may change a passband of the second filter to a third frequency band narrower than the second frequency band when it is determined that an interference of the amplified first signal or the amplified second signal to a receiving portion of the auxiliary transmitter exceeds a specific threshold value.

In one embodiment, the mobile terminal may further include a first Digital Analog Converter (DAC) and a second DAC connected to the first filter and the second filter, respectively. At this time, the first DAC and the second DAC may be connected to a Digital Pre-Distortion (DPD) compensator. In addition, the DPD compensator may compensate for non-linearity of the amplifiers in the main transmitter or the non-linearity of the Power Amplifier (PA) which feeds the antenna.

In one embodiment, the controller may adjust a gain of the third amplifier such that a level of the amplified second signal coincides with a level of the amplified first signal in a specific frequency within the frequency bands adjacent to the first frequency band and transmit the adjusted gain of the third amplifier to the DPD compensator. Accordingly, the DPD compensator may compensate for the non-linearity of the amplifiers in the main transmitter based on the transmitted gain.

In one embodiment, the mobile terminal may further include first to n-th array antennas. At this time, the main transmitter may include first to n-th main transmitting portions connected to the first to n-th array antennas, respectively, and the first to n-th main transmitting portions may transmit the amplified first signal to the first to n-th array antennas. The controller may control the amplified first signal and a part of the amplified second signal to be combined with each other when the distortion signal is to occur.

According to another aspect of the present invention, a method for controlling a mobile terminal may include a first signal amplification control process of controlling a main transmitter to amplify a first signal of a first frequency band through a first path and a second path, a second signal amplification control process for controlling an auxiliary transmitter to amplify a second signal of a second frequency band through a third path, a distortion occurrence determination process of determining whether a distortion signal is to occur in frequency bands adjacent to the first frequency band due to the amplified first signal. The method may further include a distortion signal control process of controlling the distortion signal such that the amplified first signal and the amplified second signal are combined with each other when the distortion signal is to occur in the adjacent frequency bands.

In one embodiment, the method may further include a low power transmission mode determination process of determining whether a power transmission mode is a low power transmission mode when the distortion signal is not to occur in the adjacent frequency bands. Meanwhile, a low power signal transmission control process may be performed to control the amplified second signal to be transmitted to a base station or a peripheral terminal only through the auxiliary transmitter when it is determined that the power transmission mode is the low power transmission mode. On the other hand, a high-power signal transmission control process may be performed to control the amplified first signal to be transmitted to the base station only through the main transmitter when it is determined that the power transmission mode is a high-power transmission mode.

Hereinafter, effects of a mobile terminal and a transmitter including amplifiers according to the present invention will be described.

According to at least one of embodiments of the present invention, an RF front end with improved non-linearity and a mobile terminal can be provided.

In addition, according to at least one of embodiments of the present invention, non-linearity of an amplifier can be improved by using an auxiliary transmitter operating in a wide band and a main transmitter operating in a narrow band, thereby maintaining a noise characteristic of a receiving band.

Furthermore, according to at least one of embodiments of the present invention, a mobile terminal including an RF front end capable of reducing a layout area while improving non-linearity even in a structure including a plurality of antennas can be provided.

Further scope of applicability of the present invention will become apparent from the following detailed description. It should be understood, however, that the detailed description and specific examples, such as the preferred embodiment of the invention, are given by way of illustration only, since various changes and modifications within the spirit and scope of the invention will be apparent to those skilled in the art.

MODES FOR CARRYING OUT THE PREFERRED EMBODIMENTS

Figure 1A:
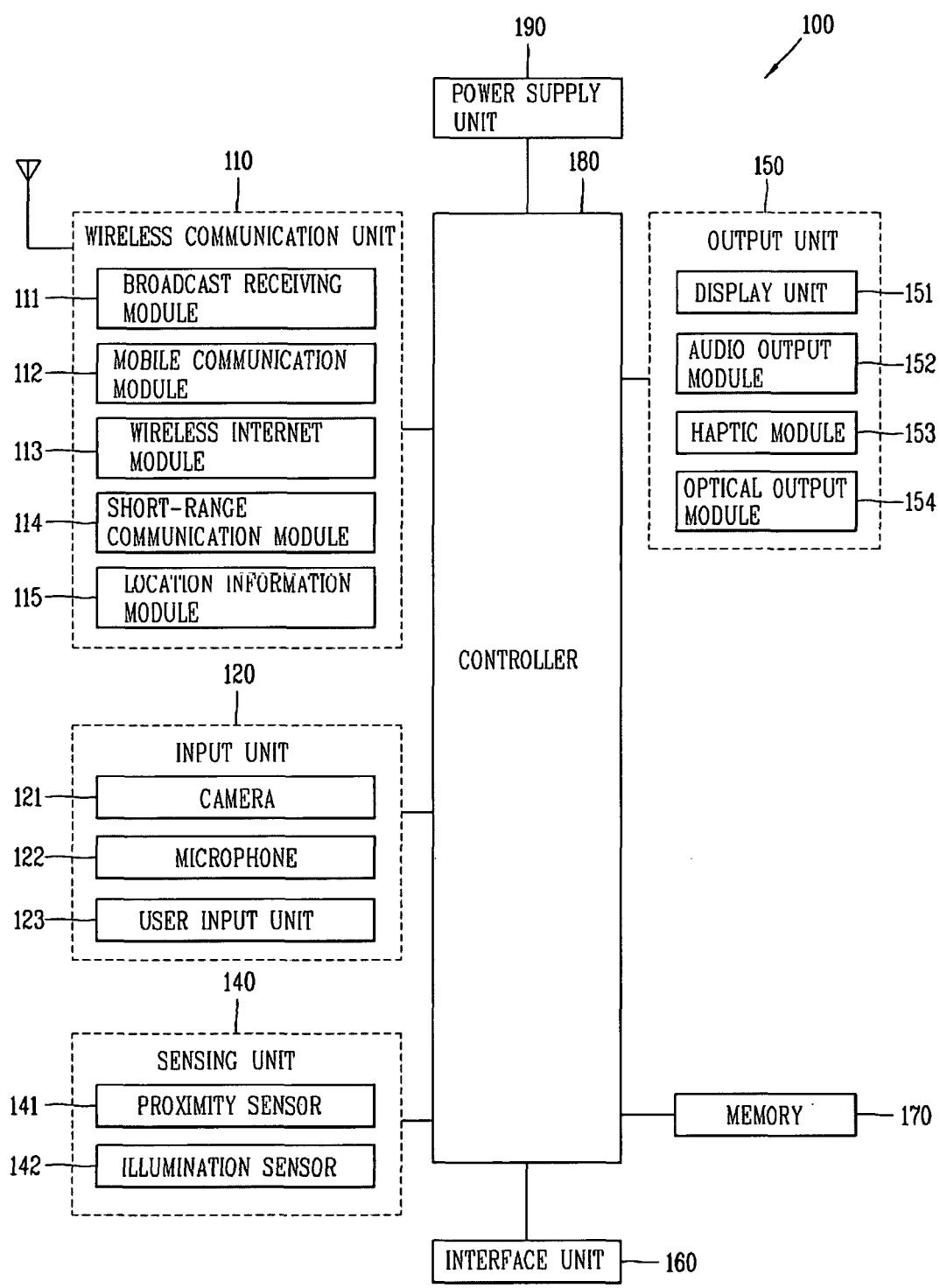
FIG. 1A is a block diagram of a mobile terminal in accordance with one exemplary embodiment of the present invention.

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra-books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1B:
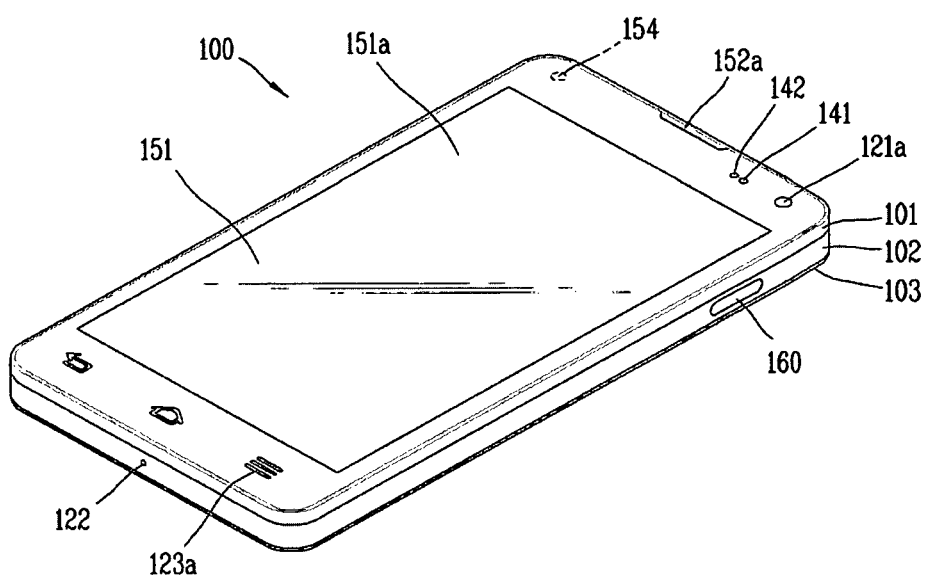
FIGS. 1B and 1C are conceptual views illustrating one example of a mobile terminal according to the present invention, viewed from different directions.
Figure 1C:
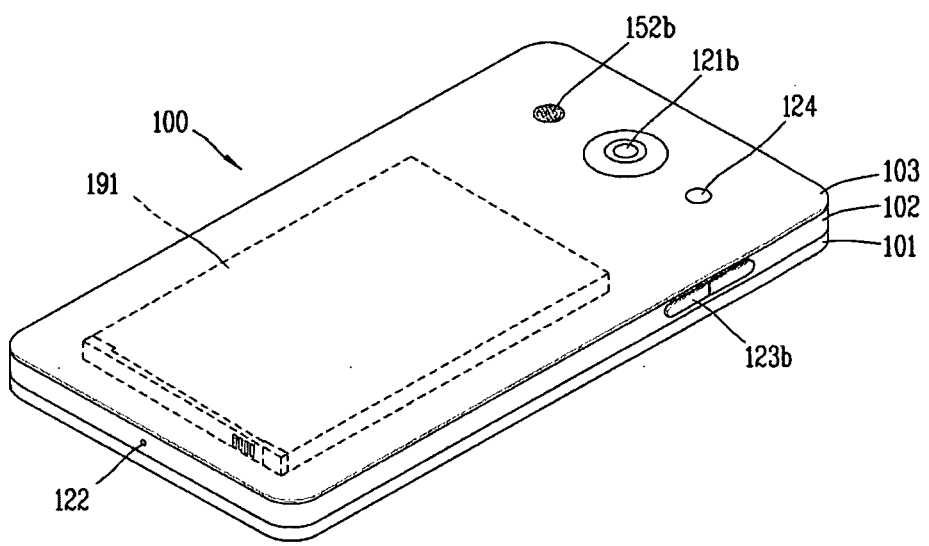

Referring to FIGS. 1A to 1C, FIG. 1A is a block diagram of a mobile terminal in accordance with one exemplary embodiment of the present invention, and FIGS. 1B and 1C are conceptual views illustrating one example of a mobile terminal, viewed from different directions.

The mobile terminal 100 may be shown having components such as a wireless communication unit 110, an input unit 120, a sensing unit 140, an output unit 150, an interface unit 160, a memory 170, a controller 180, and a power supply unit 190. It is understood that implementing all of the illustrated components is not a requirement, and that greater or fewer components may alternatively be implemented.

In more detail, the wireless communication unit 110 may typically include one or more modules which permit communications such as wireless communications between the mobile terminal 100 and a wireless communication system, communications between the mobile terminal 100 and another mobile terminal, or communications between the mobile terminal 100 and an external server. Further, the wireless communication unit 110 may typically include one or more modules which connect the mobile terminal 100 to one or more networks.

The wireless communication unit 110 may include one or more of a broadcast receiving module 111, a mobile communication module 112, a wireless Internet module 113, a short-range communication module 114, and a location information module 115.

The input unit 120 may include a camera 121 or an image input unit for obtaining images or video, a microphone 122, which is one type of audio input device for inputting an audio signal, and a user input unit 123 (for example, a touch key, a mechanical key, and the like) for allowing a user to input information. Data (for example, audio, video, image, and the like) may be obtained by the input unit 120 and may be analyzed and processed according to user commands.

The sensing unit 140 may typically be implemented using one or more sensors configured to sense internal information of the mobile terminal, the surrounding environment of the mobile terminal, user information, and the like. For example, the sensing unit 140 may include at least one of a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like). The mobile terminal disclosed herein may be configured to utilize information obtained from one or more sensors of the sensing unit 140, and combinations thereof.

The output unit 150 may typically be configured to output various types of information, such as audio, video, tactile output, and the like. The output unit 150 may be shown having at least one of a display unit 151, an audio output module 152, a haptic module 153, and an optical output module 154. The display unit 151 may have an inter-layered structure or an integrated structure with a touch sensor in order to implement a touch screen. The touch screen may function as the user input unit 123 which provides an input interface between the mobile terminal 100 and the user and simultaneously provide an output interface between the mobile terminal 100 and a user.

The interface unit 160 serves as an interface with various types of external devices that are coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). Application programs may be stored in the memory 170, installed in the mobile terminal 100, and executed by the controller 180 to perform an operation (or function) for the mobile terminal 100.

The controller 180 typically functions to control an overall operation of the mobile terminal 100, in addition to the operations associated with the application programs. The controller 180 may provide or process information or functions appropriate for a user by processing signals, data, information and the like, which are input or output by the aforementioned various components, or activating application programs stored in the memory 170.

Also, the controller 180 may control at least some of the components illustrated in FIG. 1A, to execute an application program that have been stored in the memory 170. In addition, the controller 180 may control at least two of those components included in the mobile terminal to activate the application program.

The power supply unit 190 may be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

At least part of the components may cooperatively operate to implement an operation, a control or a control method of a mobile terminal according to various embodiments disclosed herein. Also, the operation, the control or the control method of the mobile terminal may be implemented on the mobile terminal by an activation of at least one application program stored in the memory 170.

Referring to FIGS. 1B and 1C, the disclosed mobile terminal 100 includes a bar-like terminal body. However, the electronic device 100 may alternatively be implemented in any of a variety of different configurations. Examples of such configurations include watch type, clip-type, glasses-type, or a folder-type, flip-type, slide-type, swing-type, and swivel-type in which two and more bodies are combined with each other in a relatively movable manner, and combinations thereof. Discussion herein will often relate to a particular type of mobile terminal. However, such teachings with regard to a particular type of mobile terminal will generally apply to other types of mobile terminals as well.

Here, considering the mobile terminal 100 as at least one assembly, the terminal body may be understood as a conception referring to the assembly.

The mobile terminal 100 will generally include a case (for example, frame, housing, cover, and the like) forming the appearance of the terminal. In this embodiment, the case is formed using a front case 101 and a rear case 102. Various electronic components are interposed into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

The mobile terminal 100 may include a display unit 151, first and second audio output module 152a and 152b, a proximity sensor 141, an illumination sensor 142, an optical output module 154, first and second cameras 121a and 121b, first and second manipulation units 123a and 123b, a microphone 122, an interface unit 160, and the like.

Hereinafter, as illustrated in FIGS. 1B and 1C, description will be given of the exemplary mobile terminal 100 in which the front surface of the terminal body is shown having the display unit 151, the first audio output module 152a, the proximity sensor 141, the illumination sensor 142, the optical output module 154, the first camera 121a, and the first manipulation unit 123a, the side surface of the terminal body is shown having the second manipulation unit 123b, the microphone 122, and the interface unit 160, and the rear surface of the terminal body is shown having the second audio output module 152b and the second camera 121b.

However, those components may not be limited to the arrangement. Some components may be omitted or rearranged or located on different surfaces. For example, the first manipulation unit 123a may not be located on the front surface of the terminal body, and the second audio output module 152b may be located on the side surface of the terminal body other than the rear surface of the terminal body.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

The display module 151 may include at least one of a liquid crystal display (LCD), a thin film transistor-LCD (TFT LCD), an organic light-emitting diode (OLED), a flexible display, a three-dimensional (3D) display and an e-ink display.

The display unit 151 may be implemented using two display devices, according to the configuration type thereof. For instance, a plurality of the display units 151 may be arranged on one side, either spaced apart from each other, or these devices may be integrated, or these devices may be arranged on different surfaces.

The display unit 151 may include a touch sensor that senses a touch with respect to the display unit 151 so as to receive a control command in a touch manner. Accordingly, when a touch is applied to the display unit 151, the touch sensor may sense the touch, and a controller 180 may generate a control command corresponding to the touch. Contents input in the touch manner may be characters, numbers, instructions in various modes, or a menu item that can be specified.

The first audio output module 152a may be implemented as a receiver for transmitting a call sound to a user's ear and the second audio output module 152b may be implemented as a loud speaker for outputting various alarm sounds or multimedia playback sounds.

The window 151a of the display unit 151 may include sound holes for emitting sounds generated from the first audio output module 152a. However, the present invention is not limited thereto, and the sounds may be released along an assembly gap between the structural bodies (for example, a gap between the window 151a and the front case 101). In this case, a hole independently formed to output audio sounds may not be seen or may otherwise be hidden in terms of appearance, thereby further simplifying the appearance of the mobile terminal 100.

The optical output module 154 may be configured to output light for indicating an event generation. Examples of such events may include a message reception, a call signal reception, a missed call, an alarm, a schedule alarm, an email reception, information reception through an application, and the like. When a user has checked a generated event, the controller 180 may control the optical output module 154 to stop the light output.

The first camera 121a may process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion. The first and second manipulation units 123a and 123b may employ any method if it is a tactile manner allowing the user to perform manipulation with a tactile feeling such as touch, push, scroll or the like. The first and second manipulation units 123a and 123b may also be manipulated through a proximity touch, a hovering touch, and the like, without a user's tactile feeling.

The drawings are illustrated on the basis that the first manipulation unit 123a is a touch key, but the present invention may not be necessarily limited to this. For example, the first manipulation unit 123a may be configured as a mechanical key, or a combination of a touch key and a push key.

The content received by the first and second manipulation units 123a and 123b may be set in various ways. For example, the first manipulation unit 123a may be used by the user to input a command such as menu, home key, cancel, search, or the like, and the second manipulation unit 123b may be used by the user to input a command, such as controlling a volume level being output from the first or second audio output module 152a or 152b, switching into a touch recognition mode of the display unit 151, or the like.

Hereinafter, description will be given of embodiments of a radio frequency amplifier circuit and a mobile terminal having the same according to the present invention with reference to the accompanying drawings. It will be apparent to those skilled in the art that the present invention may be embodied in other specific forms without departing from the spirit or essential characteristics thereof.

Figure 2:
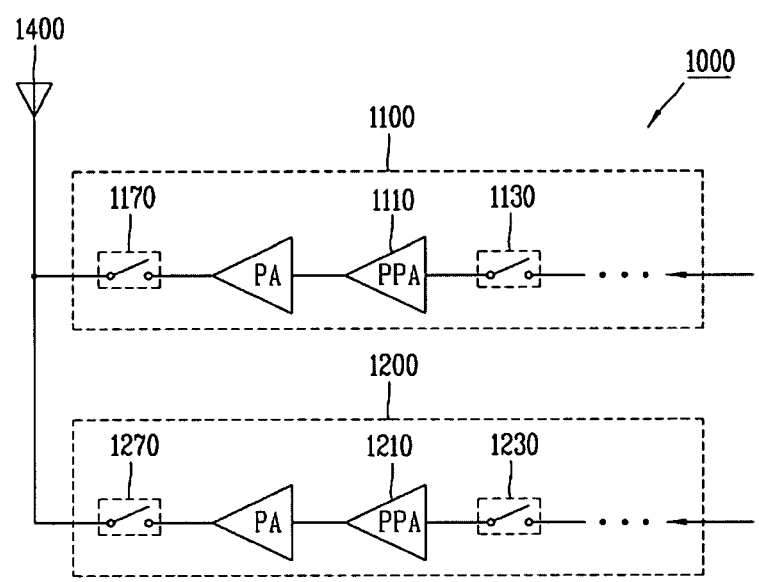
FIG. 2 is a view illustrating a mobile terminal having a main transmitter and an auxiliary transmitter according to the present invention.

FIG. 2 is a view illustrating a mobile terminal having a main transmitter and an auxiliary transmitter according to the present invention. Referring to FIG. 2, a mobile terminal 1000 includes a main transmitter 1100, an auxiliary transmitter 1200, a controller 1300, and an antenna 1400. Each of the main transmitter 1100 and the auxiliary transmitter 1100 includes at least one amplifier 1110, 1210. In this regard, the at least one amplifier 1110, 1210 corresponds to a Pre-Power Amplifier (PPA) which is positioned to a rear-end of a Power Amplifier (PA). In this invention, the "amplifier" can indicate the Pre-Power Amplifier (PPA) and the "power amplifier" can indicate High Power Amplifier (HPA). Alternatively, the "power amplifier" can indicate the Pre-Power Amplifier (PPA) and the "high power amplifier" can indicate High Power Amplifier (HPA).

Meanwhile, the main transmitter 1100 and the auxiliary transmitter 1200 according to the present invention may correspond to the wireless communication unit 110 of FIG. 1A. Accordingly, the wireless communication unit 110 may include the main transmitter 1100 and the auxiliary transmitter 1200, which are one or more modules that enable wireless communication. The main transmitter 1100 and the auxiliary transmitter 1200 may perform wireless communications between the mobile terminal 1000 and a wireless communication system, between the mobile terminal 1000 and another mobile terminal 100, or between the mobile terminal 1000 and an external server.

On the other hand, the mobile terminal 1000 may perform wireless communications with the broadcast receiving module 111, the mobile communication module 112, the wireless Internet module 113, and the short-range communication module 114, using the main transmitter 1100 and the auxiliary transmitter 1200. Therefore, the communication performance of the communication module can be improved by compensating for non-linearity of the amplifier 1110 using the main transmitter 1100 and the auxiliary transmitter 1200.

In this regard, first switches 1130 and 1230 are connected to rear ends of the amplifiers 1110 and 1210 to control On or Off of input signals toward the amplifiers. Alternatively, second switches 1170 and 1270 may be connected to front ends of the amplifiers 1110 and 1210 to control On or Off of output signals which are transferred from the power amplifiers to the antenna 1400. Therefore, the first signal and/or the second signal amplified by the main transmitter 1100 and the auxiliary transmitter 1200 are transmitted to the antenna 1400 by the first switches 1130 and 1230 or the second switches 1170 and 1270. In this regard, the second switches 1170 and 1270 may perform the function of on/off of RF output, independently from or replacing with the first switches 1130 and 1230.

Figure 3:
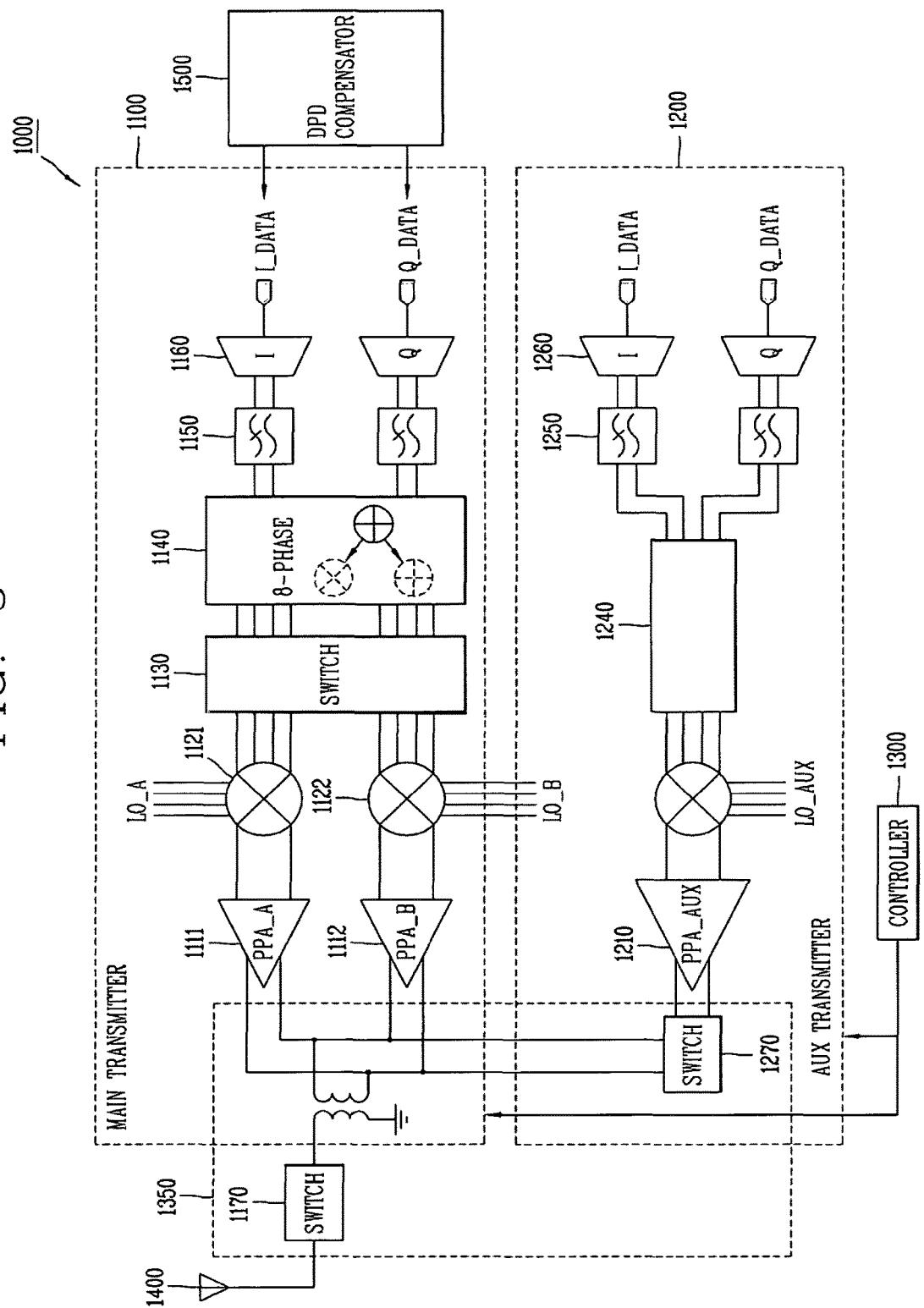
FIG. 3 is a view illustrating a detailed configuration of the mobile terminal having the main transmitter and the auxiliary transmitter according to the present invention.

On the other hand, FIG. 3 illustrates a detailed configuration of the mobile terminal having the main transmitter and the auxiliary transmitter according to the present invention. Referring to FIG. 3, the main transmitter 1100 includes a first amplifier 1111, a second amplifier 1112, a first local oscillator (LO) 1121, and a second local oscillator 1122. The main transmitter 1100 may further include a switch 1130, a first phase controller 1140, a first filter 1150, and a first Digital Analog Converter (DAC) 1160.

In addition, the auxiliary transmitter 1200 includes a third amplifier 1210 and a third local oscillator 1220. The auxiliary transmitter 1200 may further include a second phase controller 1240, a second filter 1250, and a second DAC 1260.

The mobile terminal 1000 may further include a signal combiner 1350 for selectively synthesizing signals in the main transmitter 1100 and the auxiliary transmitter 1200. The mobile terminal 1000 may further include a digital pre-distortion (DPD) compensator 1500 to compensate for the non-linearity of the power amplifiers in the main transmitter.

Hereinafter, description will be given in detail of a method for improving the non-linearity of the power amplifier according to the present invention. In this regard, FIG. 4 illustrates magnitudes, in frequency bands, of signals on signal paths of the main transmitter and the auxiliary transmitter of FIG. 3.

The main transmitter 1100 is configured to amplify and transmit a first signal of a first frequency band through a first path and a second path. Here, the first path is a path of a signal passing through the first amplifier 1111, and the second path is a path of a signal passing through the second amplifier 1112. The auxiliary transmitter 1200 is configured to amplify and transmit a second signal of a second frequency band through a third path. Here, the third path is a path of a signal passing through the third amplifier 1210. In other words, the main transmitter 1100 is configured to operate in a first frequency band that is a narrow band, and the auxiliary transmitter 1200 is configured to operate in a second frequency band that is a wide band. At this time, as illustrated in FIG. 4, the second frequency band is set to include the first frequency band.

Figure 4:
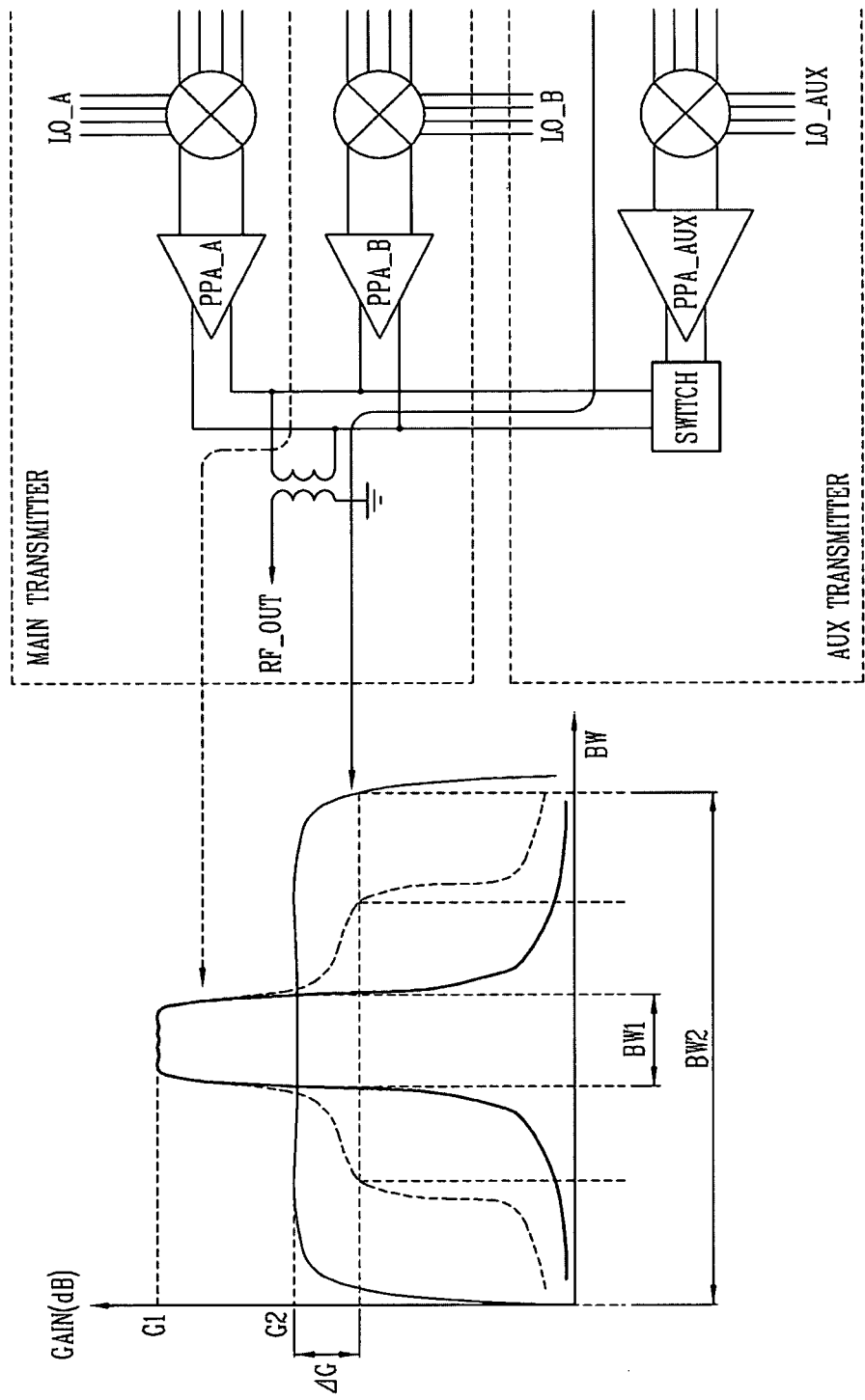
FIG. 4 is a view illustrating magnitudes, in frequency bands, of signals on signal paths of the main transmitter and the auxiliary transmitter of FIG. 3.

Referring to FIG. 4, the main transmitter 1100 has a gain of G1 in the first frequency band, and the auxiliary transmitter 1200 has a gain of G2 in the second frequency band. Here, a main path corresponding to the first and second paths is used for high output power. The main path has low noise in a receiving (RX) band. Baseband IQ (BBIQ) filtering is required for the low noise on the receiving path.

An auxiliary path is used for low output power. In this regard, a signal on the auxiliary path may be a signal that is lower than the signal on the main path by a specific level, for example, by about 30 dB. Therefore, noise requirement in the receiving band is also reduced by the same level, for example, by about 30 dB. This means that noise characteristic of a system is not affected even though bandwidths of the BBIQ filters on the auxiliary path, namely, the third and fourth filters 1251 and 1252 increase. Meanwhile, the bandwidth of the first filter 1150 may correspond to a bandwidth BW1 of the first frequency band. Also, the bandwidth of the second filter 1250 may be increased by a bandwidth BW2 of the second frequency band. For example, the bandwidth of the second filter 1250 may be at least three times wider than the bandwidth of the first filter 1150. This makes it possible for a pre-distortion signal to be fed through the auxiliary path resulting from the bandwidth of the second filter 1250. Therefore, high output power with improved linearity can be transmitted through a narrow band by using the main path and the auxiliary path together. Low output power can also be transmitted by using only the auxiliary path. Distortion generated from the first and second amplifiers 1111 and 1112 or by additional power amplifies may be improved by the aforementioned pre-distortion signal. This distortion does not exceed a specific level of a high output power signal, for example, has a value less than 30 dBc based on the high output power signal. Thus, the output from the auxiliary transmitter 1200 is sufficient to remove unwanted spectral components. This pre-distortion manner thus has advantages in view of implementing a transmitter without an additional silicon region and lowering the noise characteristic in a receiving band.

Meanwhile, the controller 1300 controls specific operations of the main transmitter 1100 and the auxiliary transmitter 1200. That is, when the distortion signal is to occur in frequency bands adjacent to the first frequency band due to the amplified first signal, the controller 1300 controls the amplified first signal and the amplified second signal to be combined with each other.

Referring to FIG. 4, the adjacent frequency bands are left and right frequency domains of the first frequency band, and a distortion signal having a size of G2 to G2-DG is generated in the corresponding frequency domains. In this regard, G1 is a gain of the main transmitter and G2 is a gain of the auxiliary transmitter. Meanwhile, a signal resulting from the main transmitter output is the signal with sidelobes, is represented by the dashed line. The sidelobes are a result of main transmitter non-linearity or non-linearity of PA in the main transmitter. Since the auxiliary transmitter has gain of G2 and much wider bandwidth BW2 than BW1, and thus it is possible to generate predistortion signal to the auxiliary transmitter which will generate opposite signal to the side lobes. The resulting waveform is represented ideally in the thick line with no sidelobes in the figure.

More specifically, a difference between the amplified first signal and the amplified second signal in the frequency domains is DG or less. Therefore, as an amount of distortion signals in the frequency domains is decreased from G2 to maximum DG, the linearity of the power amplifier is improved. For this, the controller 1300 adjusts a gain of the third amplifier 1210 so that a level of the amplified second signal coincides with a level of the amplified first signal at a specific frequency within the frequency bands adjacent to the first frequency band. For example, the controller 1300 may adjust the gain of the third amplifier 1210 so that the level of the amplified second signal coincides with the level of the amplified first signal at right and left boundary frequencies fc of the first frequency band. That is, the controller 1300 may adjust the gain of the third amplifier 1210 to a value proportional to G2 at the right and left boundary frequencies fc, so that the levels of the amplified first and second signals may coincide with G2.

Hereinafter, the noise characteristics according to the bandwidths of the aforementioned filters will be described. In this regard, the first filter 1150 is configured to pass an in-phase component and a quadrature-phase component of the first signal, respectively, in the first frequency band. In addition, the second filter 1250 is configured to pass an in-phase component and a quadrature-phase component of the second signal, respectively, in the second frequency band. Here, the first and second frequency bands are frequency bands in a base band, which may be different from an RF frequency band in the amplifier.

Meanwhile, the controller 1300 determines whether an interference of the amplified first signal or the amplified second signal to a receiving portion in the auxiliary transmitter 1200 exceeds a specific threshold value. At this time, when the controller 1300 determines that the interference to the receiving portion exceeds the specific threshold value, a passband of the second filter 1250 may be changed to a third frequency band narrower than the second frequency band. At this time, the third frequency band may be narrower than the second frequency band and be wider than the first frequency band. In this regard, referring to FIG. 4, the third frequency band may be configured to include a frequency domain where distortion occurs.

Meanwhile, when the distortion signal is not to occur in the adjacent frequency bands, the controller 1300 may control the amplified first signal to be transmitted to a base station only through the main transmitter 1100. On the other hand, the controller 1300 may perform transmission only through the auxiliary transmitter 1200 in a low power transmission mode. That is, when it is determined that the power transmission mode is the low power transmission mode, the controller 1300 may control the amplified second signal to be transmitted to the base station or a peripheral terminal only through the auxiliary transmitter 1200.

On the other hand, referring to FIG. 2, the first amplifier 1111 is connected to the first local oscillator 1121 on the first path to amplify the in-phase component of the first signal. In addition, the second amplifier 1112 is connected to the second local oscillator 1122 on the second path to amplify the quadrature-phase component of the first signal. In this regard, the first LO 1121 and the second LO 1122 is implemented physically in one local oscillator with many signals derived from the one local oscillator. For example, many signals are the phase shifted complex signals I and Q (in-phase and quadrature).

Meanwhile, as described above, the signal combiner 1350 for selectively synthesizing signals in the main transmitter 1100 and the auxiliary transmitter 1200 may combine the signals in various ways. In this regard, the signal combiner 1350 may be configured to combine the amplified in-phase component and the amplified quadrature-phase component of the first signal.

Also, the signal combiner 1350 may be configured to combine signals from the auxiliary transmitter 1200. In this regard, the third amplifier 1210 is connected to the third local oscillator 1220 on the third path to amplify the second signal. At this time, when the distortion signal is to occur, the controller 1300 may control the signal combiner 1350 to combine the amplified second signal with the amplified first signal. Here, the meaning that "the distortion signal is to occur" includes not only a case where the distortion signal has already occurred, but also a case where it is predetermined that the distortion signal is to occur. In this regard, an output power value according to an input power value of the main transmission unit 1100 can be estimated to predetermine whether or not the distortion signal is to occur.

Meanwhile, the switch 1130 controls the connection between the first to third paths and the first to third local oscillators 1121, 1122 and 1220. In this regard, the switch 1130 may control the connection state according to the power transmission mode and the occurrence of distortion. When it is determined that the power transmission mode is the low power transmission mode, the third path may be connected to the third local oscillator 1220 through the switch 1130. On the other hand, when it is determined that the power transmission mode is a high-power transmission mode and no distortion is to occur, the first path and the second path are connected to the first local oscillator 1121 and the second local oscillator 1122 through the switch 1130. When it is determined that the power transmission mode is the high-power mode and distortion is to occur, the first to third paths may be connected to the first to third oscillators 1121, 1122, and 1220 through the switch 1130.

The first DAC 1160 and the second DAC 1260 are connected to the first filter 1150 and the second filter 1250, respectively, and connected to the DPD compensator 1500. In addition, the DPD compensator 1500 can be connected to the DAC in the auxiliary path. The DPD compensator 1500 is configured to compensate for the non-linearity of the power amplifiers in the main transmitter 1100. In this regard, the controller 1300 may adjust the gain of the third amplifier such that the level of the amplified second signal coincides with the level of the amplified first signal at a specific frequency within the frequency bands adjacent to the first frequency band. In addition, the controller 1300 may transmit the adjusted gain of the third amplifier or a value associated with the adjusted gain to the DPD compensator 1500. Accordingly, the DPD compensator 1500 may compensate for the non-linearity of the power amplifiers in the main transmitter 1100, based on the transmitted gain or the value associated with the gain. Accordingly, the non-linearity of the power amplifiers in the main transmitter 1100 can be improved more effectively by using both the DPD compensator 1500 and the auxiliary transmitter 1200. In addition, the DPD compensator 1500 has an advantage in feedback factor which can make simplify simplified a feedback control with the gain value of the power amplifier in the auxiliary transmitter 1200 and the value associated with the gain.

Figure 5:
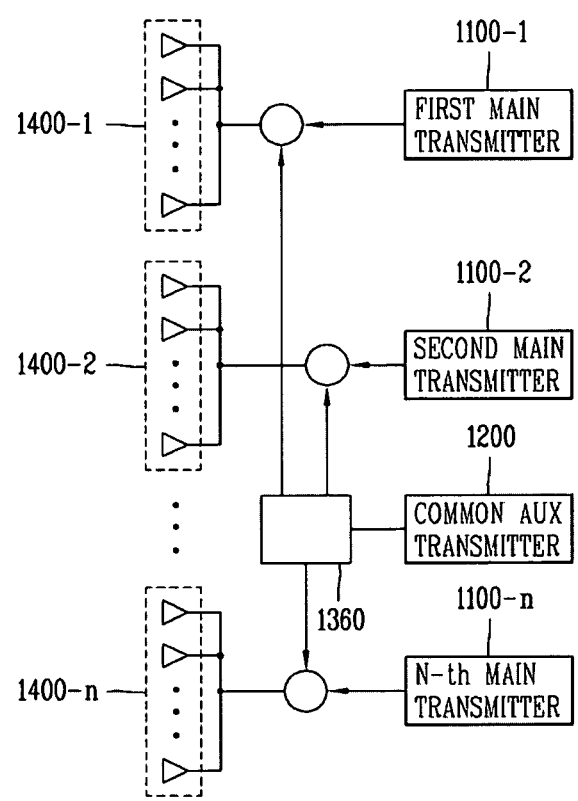
FIG. 5 is a view illustrating an example of a mobile terminal having a main transmitter, an auxiliary transmitter, and a plurality of array antennas according to the present invention.

Meanwhile, the method of improving the distortion characteristic of the power amplifier according to the present invention can also be utilized in a fifth generation (5G) communication system in addition to a 4G communication system. On the other hand, in the 4G communication system, two or more antennas 1400 may support multi-input multiple-output (MIMO). On the other hand, in the 5G communication system, two or more array antennas 1400 may support beam-forming as well as the MIMO. In this regard, FIG. 5 illustrates an example of a mobile terminal having a main transmitter, an auxiliary transmitter, and a plurality of array antennas according to the present invention. Referring to FIG. 5, the plurality of array antennas may include a first array antenna 1400-1, a second array antenna 1400-2, and an n-th array antenna 1400-n. At this time, n×n MIMOs may be supported by using the first to n-th array antennas 1400-1 to 1400-n. Each of the first to n-th array antennas 1400-1 to 1400-n may include a plurality of antenna elements, so as to perform beam-forming by adjusting phases applied to the plurality of antenna elements.

The main transmitter 1100 of FIG. 2 includes first to n-th main transmitting portions 1100-1 to 1100-n of FIG. 5 according to a number of the plurality of array antennas. That is, the main transmitter includes the first to n-th main transmitting portions 1100-1 to 1100-n connected to the first to n-th array antennas 1400-1 to 1400-n, respectively. On the other hand, the auxiliary transmitter 1200 may include first to n-th auxiliary transmitting portions 1200-1 through 1200-n according to the number of the plurality of array antennas. Alternatively, the auxiliary transmitter 1200 may include only one auxiliary transmitting portion 1200. At this time, when the distortion signal is to occur in the frequency bands adjacent to the first frequency band by the amplified first signal, the controller 1300 may control the amplified first signal and a part of the amplified second signal to be combined with each other. Here, the "part of the second signal" means a signal distributed through a power distributor 1360 from the second signal output from the one auxiliary transmitter 1200. Therefore, a common auxiliary transmitter structure using only the one auxiliary transmitter 1200 illustrated in FIG. 5 has an advantage in that an area occupied by a circuit is reduced, as compared with a structure using a plurality of auxiliary transmitting portions. In addition, integral monitoring and control of the plurality of first to n-th main transmitting portions 1100-1 to 1100-n is enabled by use of the one common auxiliary transmitter 1200.

The foregoing description has been given of the power amplifier circuit and the mobile terminal having the same according to one aspect of the present invention. Hereinafter, a method of controlling the power amplifier circuit according to another aspect of the present invention will be described. Meanwhile, the contents described in the power amplifier circuit and the mobile terminal having the same described above may be used in combination with the following control method.

Figure 6:
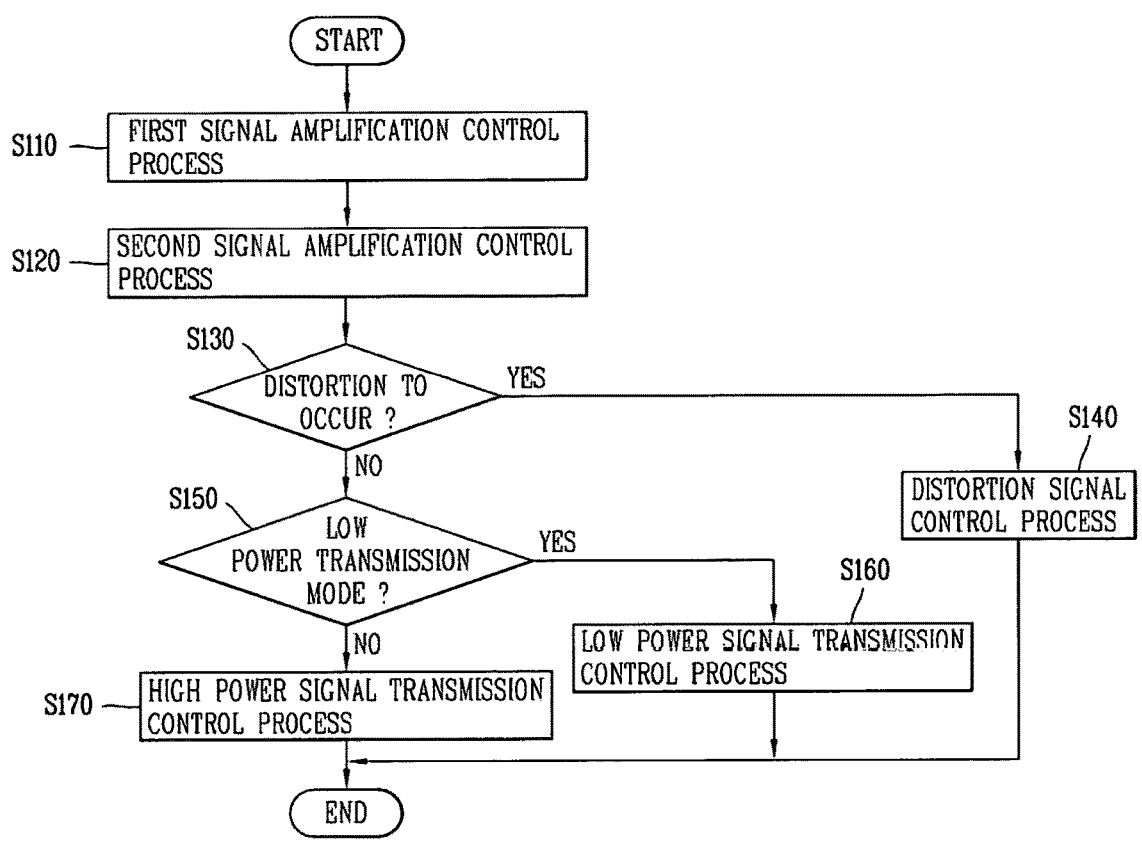
FIG. 6 is a flowchart illustrating a method for improving non-linearity of an amplifier circuit according to the present invention.

In this regard, FIG. 6 is a flowchart illustrating a method for improving non-linearity of a power amplifier circuit in accordance with the present invention. Referring to FIG. 6, the method for improving the non-linearity of the power amplifier circuit may be performed by the controller 1300.

At this time, the controller 1300 corresponds to a processor or a modem, and corresponding operations may be performed by a Communication Processor (CP) or an Application Processor (AP). Meanwhile, the method for improving the non-linearity of the power amplifier circuit includes a first signal amplification control process (S110), a second signal amplification control process (S120), a distortion occurrence determination process (S130), and a distortion signal control process (S140). The method for improving the non-linearity of the power amplifier circuit may further include a low power transmission mode determination process (S150), a low power signal transmission control process (S160), and a high-power signal transmission control process (S170). Meanwhile, the above-described processes are not limited to the listed order, but may be performed by changing the order freely according to applications.

In the first signal amplification control process (S110), the controller 1300 controls the main transmitter to amplify the first signal of the first frequency band through the first path and the second path. Meanwhile, in the second signal amplification control process (S120), the controller 1300 controls the auxiliary transmitter to amplify the second signal of the second frequency band through the third path. In this case, in the distortion occurrence determination process (S130), it is determined whether a distortion signal is to occur in the frequency bands adjacent to the first frequency band by the amplified first signal.

Meanwhile, in the distortion signal control process (S140), when the distortion signal is to occur in the adjacent frequency bands, the controller 1300 controls the distortion signal in such a manner that the amplified first signal and the amplified second signal are combined with each other. On the other hand, when it is determined that no distortion is to occur in the adjacent frequency bands, the controller 1300 performs the low power transmission mode determination process (S150) to determine whether the power transmission mode is the low power transmission mode. At this time, when it is determined that the power transmission mode is the low power transmission mode, the controller 1300 performs the low power signal transmission control process (S160) to transmit the amplified second signal to the base station or the peripheral terminal only through the auxiliary transmitter. On the other hand, when it is determined that the power transmission mode is a high-power transmission mode, the controller 1300 performs the high-power signal transmission control process (S170) to transmit the amplified first signal to the base station through only the main transmitter.

Hereinafter, technical effects of the power amplifier circuit and the mobile terminal having the same according to the present invention will be described.

According to at least one of embodiments of the present invention, an RF front end and a mobile terminal with improved non-linearity can be provided.

In addition, according to at least one of embodiments of the present invention, non-linearity of a power amplifier can be improved by using an auxiliary transmitter operating in a wide band and a main transmitter operating in a narrow band, thereby maintaining receiving band noise characteristics.

Furthermore, according to at least one of embodiments of the present invention, a mobile terminal having an RF front end, which is capable of reducing an arrangement area while improving non-linearity even in a structure including a plurality of antennas, can be provided.

Further scope of applicability of the present invention will become apparent from the following detailed description. It should be understood, however, that the detailed description and specific examples, such as the preferred embodiment of the invention, are given by way of illustration only, since various changes and modifications within the spirit and scope of the invention will be apparent to those skilled in the art.

In relation to the present invention, design and operations of the main transmitter and auxiliary transmitter including a power amplifier can be implemented as computer-readable codes in a program-recorded medium. The computer-readable medium may include all types of recording devices each storing data readable by a computer system. Examples of such computer-readable media may include hard disk drive (HDD), solid state disk (SSD), silicon disk drive (SDD), ROM, RAM, CD-ROM, magnetic tape, floppy disk, optical data storage element and the like. Also, the computer-readable medium may also be implemented as a format of carrier wave (e.g., transmission via an Internet). The computer may include the controller 180 of the terminal. Therefore, it should also be understood that the above-described embodiments are not limited by any of the details of the foregoing description, unless otherwise specified, but rather should be construed broadly within its scope as defined in the appended claims, Therefore, all changes and modifications that fall within the metes and bounds of the claims, or equivalents of such metes and bounds are therefore intended to be embraced by the appended claims.

The invention claimed is:

1. A mobile terminal, comprising:
   a main transmitter to amplify and transmit a first signal of a first frequency band through a first path and a second path;
   an auxiliary transmitter to amplify and transmit a second signal of a second frequency band through a third path; and
   a controller to control a distortion signal by combining the amplified first signal and the amplified second signal with each other when the distortion signal is to occur in frequency bands adjacent to the first frequency band, and
   wherein the main transmitter operates in the first frequency band that is a narrow band,
   wherein the auxiliary transmitter operates in the second frequency band that is a wide band, and
   wherein the second frequency band is set to include the first frequency band.

2. The terminal of claim 1, wherein the controller controls the amplified first signal to be transmitted to a base station only through the main transmitter when the distortion signal is not to occur in the adjacent frequency bands.

3. The terminal of claim 1, wherein the controller controls the amplified second signal to be transmitted to the base station or a peripheral terminal only through the auxiliary transmitter when it is determined that a power transmission mode is a low power transmission mode.

4. The terminal of claim 1, wherein the main transmitter comprises:
   a first amplifier connected to a first Local Oscillator (LO) on the first path to amplify an in-phase component of the first signal;
   a second amplifier connected to a second local oscillator on the second path to amplify a quadrature-phase component of the first signal; and
   a signal combiner to combine the amplified in-phase component and the amplified quadrature-phase component of the first signal.

5. The terminal of claim 4, wherein the auxiliary transmitter further comprises a third amplifier connected to a third local oscillator on the third path to amplify the second signal, and
wherein the signal combiner combines the amplified second signal with the amplified first signal when the distortion signal is to occur.

6. The terminal of claim 5, further comprising:
a phase controller to control a phase value of the second signal, such that the amplified first signal and the amplified second signal to be canceled with each other in the frequency bands adjacent to the first frequency band; and
a switch to control the connection between the first to third paths and the local oscillators.

7. The terminal of claim 5, wherein the third path is connected to the third local oscillator through the switch when it is determined that a power transmission mode is a low power transmission mode,
wherein the first path and the second path are connected to the first local oscillator and the second local oscillator through the switch when it is determined that the power transmission mode is a high-power transmission mode and the distortion is not to occur, and
wherein the first to third paths are connected to the first to third local oscillators through the switch when it is determined that the power transmission mode is the high-power transmission mode and the distortion is to occur.

8. The terminal of claim 5, wherein the controller adjusts a gain of the third amplifier such that a level of the amplified second signal coincides with a level of the amplified first signal in a specific frequency within the frequency bands adjacent to the first frequency band.

9. The terminal of claim 1, further comprising:
a first filter to pass an in-phase component and a quadrature-phase component of the first signal in the first frequency band; and
a second filter to pass an in-phase component and a quadrature-phase component of the second signal in the second frequency band,
wherein the controller changes a passband of the second filter to a third frequency band narrower than the second frequency band when it is determined that an interference of the amplified first signal or the amplified second signal to a receiving portion in the auxiliary transmitter exceeds a specific threshold value.

10. The terminal of claim 9, further comprising a first Digital Analog Converter (DAC) and a second DAC connected to the first filter and the second filter, respectively,
wherein the first DAC and the second DAC are connected to a Digital Pre-Distortion (DPD) compensator, and
wherein the DPD compensator compensates for non-linearity of power amplifiers in the main transmitter.

11. The terminal of claim 10, wherein the controller adjusts a gain of the third amplifier such that a level of the amplified second signal coincides with a level of the amplified first signal in a specific frequency within the frequency bands adjacent to the first frequency band, and transmits the adjusted gain of the third amplifier to the DPD compensator, and
wherein the DPD compensator compensates for the non-linearity of power amplifiers in the main transmitter based on the transmitted gain.

12. The terminal of claim 1, further comprising first to n-th array antennas,
wherein the main transmitter includes first to n-th main transmitting portions connected to the first to n-th array antennas, respectively,
wherein the first to n-th main transmitting portions transmit the amplified first signal to the first to n-th array antennas, and
wherein the controller controls the amplified first signal and a part of the amplified second signal to be combined with each other when the distortion signal is to occur.

13. A method for controlling a mobile terminal, the method comprising:
a first signal amplification control process of controlling a main transmitter to amplify a first signal of a first frequency band through a first path and a second path;
a second signal amplification control process for controlling an auxiliary transmitter to amplify a second signal of a second frequency band through a third path;
a distortion occurrence determination process of determining whether a distortion signal is to occur in frequency bands adjacent to the first frequency band due to the amplified first signal; and
a distortion signal control process of controlling the distortion signal such that the amplified first signal and the amplified second signal are combined with each other when the distortion signal is to occur in the adjacent frequency bands.

14. The method of claim 13, further comprising a low power transmission mode determination process of determining whether a power transmission mode is a low power transmission mode when the distortion signal is not to occur in the adjacent frequency bands,
wherein a low power signal transmission control process is performed to control the amplified second signal to be transmitted to a base station or a peripheral terminal only through the auxiliary transmitter when it is determined that the power transmission mode is the low power transmission mode, and
wherein a high-power signal transmission control process is performed to control the amplified first signal to be transmitted to the base station only through the main transmitter when it is determined that the power transmission mode is a high-power transmission mode.

* * * * *